THERMOELECTRIC GENERATOR AND METHOD FOR PRODUCTION OF SAME

Filed June 2, 1950

INVENTOR.
Martin J. Arvin,
BY
Brown, Jackson, Boettcher & Dienner
Attys

Patented July 14, 1953 2,645,675

UNITED STATES PATENT OFFICE 2,645,675

THERMOELECTRIC GENERATOR AND METHOD FOR PRODUCTION OF SAME

Martin J. Arvin, Carterville, Ill., assignor to Milwaukee Gas Specialty Company, Milwaukee, Wis., a corporation of Wisconsin Application June 2, 1950, Serial No. 165,801

4 Claims. (Cl. 136—4)

This invention relates, in general, to a thermoelectric generator, and has particular relation to a thermoelectric generator in the form of a thermopile comprising a plurality of thermocouples connected in series, and to a method for the production of such a thermoelectric generator.

In prior practice, it has been customary to form the dissimilar elements of thermoelectric generators individually and to join the elements to form the thermoelectric junctions as steps separate from the formation of the elements.

Prior thermoelectric generators in the form of thermopiles have also been confronted with limitations in the manner and positions in which they could be used.

One of the main objects of the present invention is to provide an improved thermoelectric generator, and, more particularly, an improved thermoelectric generator in the form of a thermopile having a multiplicity of thermoelectric generator elements and multiplicity of thermoelectric junctions.

Another object of the invention is to provide an improved thermoelectric generator having the thermoelectric generator elements and thermoelectric junctions arranged in an improved and advantageous relation and adapted to be positioned in relation to the source of heat for the hot thermojunctions in an improved and advantageous manner.

Another object of the invention is to provide an improved thermoelectric generator in which thermojunctions thereof may be formed by the step of applying or forming the thermoelectric generator elements; also a thermoelectric generator in which the thermoelectric generator elements are supported and insulated from each other except at one or more thermojunctions in an improved manner.

Another object of the invention is to provide an improved thermoelectric generator in which the hot thermojunctions are adapted to be positioned, for example, in relation to a pilot burner in an improved manner.

Another object of the invention is to provide an improved method of making thermoelectric generators according to the present invention.

Other objects and advantages of the invention will be apparent from the following detailed description and the accompanying drawing.

Figure 1:
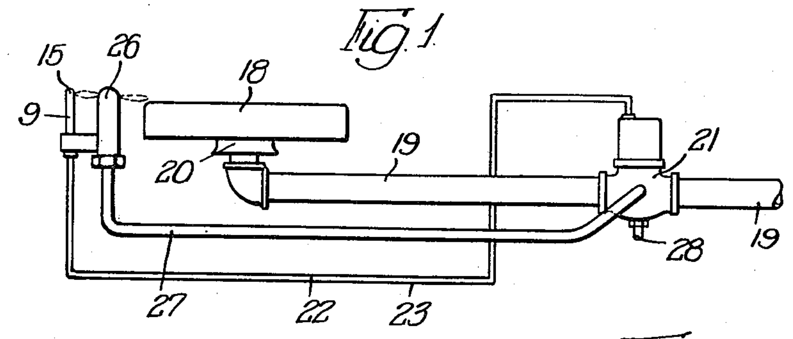
Figure 1 is a view showing diagrammatically one illustrative control circuit employing a thermoelectric generator embodying the present invention.

Referring now to the drawing, the embodiment of the invention therein illustrated shows one form of thermoelectric generator embodying the present invention and one illustrative control circuit employing such thermoelectric generator.

According to this embodiment of the invention, a central or axial thermoelectric generator element 1 is covered with a layer of thermoelectric insulating material 2 except at its inner end 3. The insulating layer 2 is covered with a dissimilar thermoelectric generator element material to form a second dissimilar thermoelectric generator element 4 insulated along the inner side thereof from the outer side of the element 1 by the insulating layer 2. The thermoelectric generator element material forming the element 4 is extended, for example in its application in overlapping relation over and against the adjacent end 3 of the element 1 and is joined thereto to form a thermojunction 5.

Where the device is to be in the form of a thermopile with a plurality or multiplicity of dissimilar elements and thermojunctions, additional layers 6, 7, 8 and 9 of alternately dissimilar thermoelectric generator element materials may be applied with intervening layers 10, 11, 12, and 13 of thermoelectric insulating material between and insulating the sides of the elements thus produced from each other. The insulating layer 10 covers not only the sides, but also the end of the element 4 to insulate it from the element 6, and the insulating layer 12 covers not only the sides but also the end of the element 7 to insulate it from the element 8.

The thermoelectric generator element material forming the element 7 is extended, for example, in its application in overlapping relation over and against the adjacent end of the element 6 and is joined thereto to form a thermojunction 14. The thermoelectric generator element material forming the element 9 is similarly extended, for example, in its application in overlapping relation over and against the adjacent end of the element 8 and is joined thereto to form a thermojunction 15.

The present invention, in its broader aspects, contemplates a thermocouple comprising only two dissimilar thermoelectric generator elements formed and joined as shown and described. The particular embodiment of the invention selected for illustration shows a thermopile having three junctions at the inner end at 5, 14, and 15. Less or additional thermojunctions may be provided within the scope of this invention by applying less or additional layers of dissimilar thermoelectric generator element materials with less or additional layers of insulating material therebetween.

The elements 1, 4, 6, 7, 8, and 9 may be formed of any suitable or preferred dissimilar thermoelectric materials. The members 1, 6, and 8 may, for example, be formed of stainless steel, copel, constantan, or any other metal in the thermoelectric series well known in the art, and the elements 4, 7, and 9 may be formed of the opposite or dissimilar metal separated in the thermoelectric series from the metal from which the elements 1, 6, and 8 are formed.

While dissimilar metals in the thermoelectric series are referred to, it is to be understood that the present invention is not, in its broader aspects, limited to use of thermoelectric generator elements made of dissimilar metals. The elements may be formed from dissimilar thermoelectric alloys, or from any other dissimilar thermoelectric materials which when joined together and heated at the hot junctions will produce a thermoelectric current. The appended claims are to be construed accordingly.

The insulating layers 2, 10, 11, 12, and 13 may be formed of any suitable thermoelectric insulating material; for example, a slurry of a ceramic composition, or a vinyl resin material such as polyvinyl formal produced by the reaction of polyvinyl acetate and formaldehyde. Such a material is available from Shawinigan Products Corporation, 350 Fifth Avenue, New York, N. Y., under the trade-mark "Formvar." This lacquer or coating is a good thermoelectric insulator, and it has flexibility, extensibility, resistance to abrasion and mechanical use, and other toughness characteristics. Moreover, it is heat resistant to the extent that it will withstand the heat to which the hot junctions of the thermoelectric generator are subjected.

The thermoelectric materials for forming the elements 4, 6, 7, 8 and 9 may be deposited upon or applied to the surfaces of the insulating layers 2, 10, 11, 12, and 13 by spraying, painting, dipping, coating, plating, chemical deposition, vacuum processes, dusting, or in any other equivalent or suitable manner. Deposition of application of conducting metals to surfaces of supports therefor by any of these methods or by equivalent methods are known under the general classification of printing processes. Such processes per se are known in the art, and therefore will not be described in detail in the present application.

The insulating layers 2, 10, 11, 12, and 13 may be applied by spraying, dipping, coating, painting, or otherwise as suitable or desired. The thermojunctions at 5, 14, and 15 are preferably formed by the steps of applying the thermoelectric materials forming the elements 4, 7 and 9, but this may vary.

The opposite end of the element 4 is joined to the adjacent end of element 6 to form a thermojunction 16, and the end of element 7 is joined to the adjacent end of element 8 to form a thermojunction 17. This, likewise, may be done in applying the respective elements.

Figures 2, 3, 4:
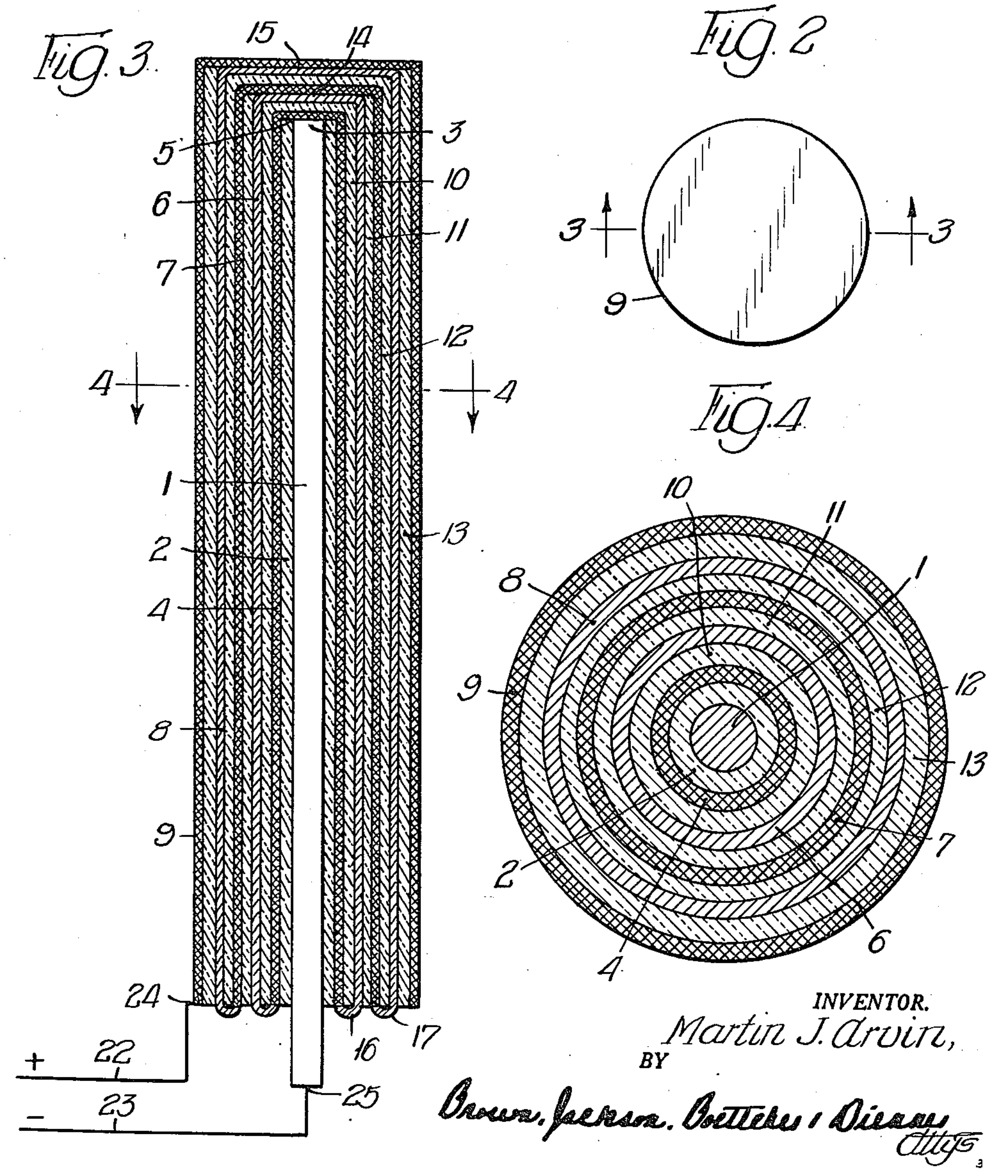
Figure 2 is a top plan view of the thermoelectric generator shown in Figure 1.
Figure 3 is a sectional view of the thermolectric generator taken in a longitudinal axial plane along the line 3—3 of Figure 2.
Figure 4 is a sectional view taken transversely along the line 4—4 of Figure 3.

The resulting thermoelectric generator comprises a central or axial element 1 and a plurality of alternately dissimilar elements 4, 6, 7, 8, and 9 of generally tubular form disposed in concentric or nested relation, with insulating layers 2, 10, 11, 12, and 13 interposed between and insulating the sides of the elements from each other. The thermojunctions 5, 14, and 15 are at the closed ends of elements 6, 7, 8 and 9, and junctions 16 and 17 are of annular form enclosing the adjacent ends of the insulating layers 10 and 12. The tubular elements 4, 6, 7, 8, and 9 are shown of circular cross-section in Figure 4, but this may vary.

Figure 1 shows a system with which the thermoelectric generator may be used. It is to be understood that the present invention is not limited to this particular use but may be employed for all similar purposes, particularly wherever it is desired to create a thermoelectric current, and more particularly the increased thermoelectric current produced by a thermopile and to use the same, for example, for control purposes.

The burner shown at 18 in Figure 1 is a main burner. It may be the main burner for a room or space heater, or it may be the main burner for a water heater or for a floor furnace, an oven burner, one or more top burners for a gas range, or any other burner and of any suitable construction.

A fuel supply pipe or conduit 19 leads to the burner 18 for the delivery of gaseous or other fuel thereto, for example, through a mixing chamber 20 to which air is admitted through adjustable air inlets (not shown), as well understood in the art.

The fuel supply conduit 19 is shown as provided with a thermoelectric safety shut-off valve indicated generally at 21. This valve 21 may, for example, be, in general, of the type shown and described in Oscar J. Leins Patent No. 2,126,564, or of any other form. The electromagnet of the valve 21 may have its coil (not shown) connected by lead conductors 22 and 23 to the junctions 24 and 25 (Figure 3) of the thermoelectric generator. In the illustrative embodiment of the invention, the junctions 16, 17, 24, and 25 constitute the cold junctions of the thermoelectric generator, and the junctions 5, 14, and 15 constitute the hot junctions, but this may vary depending upon the manner in which the thermoelectric generator is used.

The hot junctions 5, 14, and 15 of the thermoelectric generator are positioned where they will be heated by the flame of a pilot burner 26 so that the thermoelectric generator will be energized as long as the pilot burner is ignited. The pilot burner 26 is positioned not only to heat the hot junctions of the thermoelectric generator, but to light the main burner 18, and is supplied with gaseous fuel through a tube or conduit 27 connected, for example, to the fuel supply conduit 19 through the valve 21, in general, in the manner shown and described in Henry R. Alfery Patent No. 2,276,909, patented March 17, 1942. The safety shut-off valve 21 may be provided with a reset button 28 for resetting the armature to attracted position and the shut-off valve to open position. The safety shut-off valve 21 may be provided with a flow interrupter valve, in general of the type shown and described in Charles V. Hildebrecht Patent No. 2,114,446, patented April 19, 1938.

The operation of the system shown and described is well understood in the art, and therefore will not be described in the present application.

The embodiment of the invention shown in the drawing is for illustrative purposes only, and it is to be expressly understood that said drawing and the accompanying specification are not to be construed as a definition of the limits or scope of the invention, reference being had to the appended claims for that purpose.

I claim:

1. A thermoelectric generator comprising first generally cup-shaped thermoelectric generator elements formed of thermoelectric material, second generally cup-shaped thermoelectric generator elements formed of thermoelectric material dissimilar with respect to the thermoelectric material of said first elements, said first and second elements being closed at their inner ends by inner end walls, said first and second elements being nested within one another with elements of different thermoelectric material arranged successively and having side walls extending outwardly from said inner end walls, said inner end walls of adjacent elements of different thermoelectric material being joined directly together in pairs, first insulating means disposed only between the side walls of the elements of each joined pair of elements in insulating only the side walls of said elements from each other, and second insulating means disposed between both the inner end walls and the side walls of adjacent joined pairs of said elements and insulating the joined pairs of said elements from each other.

2. A thermoelectric generator according to claim 1 wherein the outer end of the side wall of each element of each joined pair of elements is joined directly to the outer end of the side wall of a dissimilar element of an adjacent joined pair of elements to form generally annular thermojunctions at the outer ends of said side walls.

3. A thermoelectric generator according to claim 1 wherein the inner cup-shaped thermoelectric generator element has its closed end spaced and electrically insulated from the closed end of the next outer cup-shaped thermoelectric generator element, an inner thermoelectric generator element of rod-like form extending within said inner cup-shaped thermoelectric generator element and joined at its inner end to the inner closed end of the inner cup-shaped thermoelectric generator element, and means electrically insulating the outer side surface of said rod-like element from the inner surface of the side wall of the inner cup-shaped element.

4. A thermoelectric generator according to claim 1 wherein the outer end of the side wall of each element of each joined pair of elements is joined directly to the outer end of the side wall of a dissimilar element of an adjacent joined pair of elements to form generally annular thermojunctions at the outer ends of said side walls, the inner cup-shaped thermoelectric generator element having its closed end spaced and electrically insulated from the closed end of the next outer cup-shaped thermoelectric generator element, an inner thermoelectric generator element, an inner thermoelectric generator element of rod-like form extending within said inner cup-shaped thermoelectric generator element and joined at its inner end to the inner closed end of the inner cup-shaped thermoelectric generator element, and means electrically insulating the outer side surface of said rod-like element from the side wall of the inner surface of the inner cup-shaped element.

MARTIN J. ARVIN.

References Cited in the file of this patent

UNITED STATES PATENTS

| Number | Name | Date |
|---|---|---|
| 2,433,575 | Ray | Mar. 30, 1948 |
| 2,466,175 | Kretsch et al. | Apr. 5, 1949 |
| 2,526,112 | Biggle | Oct. 17, 1950 |

FOREIGN PATENTS

| Number | Country | Date |
|---|---|---|
| 692,436 | Germany | June 19, 1940 |